US008509451B2

(12) United States Patent
Hayakawa

(10) Patent No.: US 8,509,451 B2
(45) Date of Patent: Aug. 13, 2013

(54) NOISE SUPPRESSING DEVICE, NOISE SUPPRESSING CONTROLLER, NOISE SUPPRESSING METHOD AND RECORDING MEDIUM

(75) Inventor: Shoji Hayakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 243 days.

(21) Appl. No.: 12/819,035

(22) Filed: Jun. 18, 2010

(65) Prior Publication Data

US 2010/0254541 A1 Oct. 7, 2010

Related U.S. Application Data

(63) Continuation of application No. PCT/JP2007/074450, filed on Dec. 19, 2007.

(51) Int. Cl.
*H03B 29/00* (2006.01)
*G10K 11/16* (2006.01)

(52) U.S. Cl.
USPC .......................... 381/71.1; 381/94.3; 381/104

(58) Field of Classification Search
USPC .................... 381/71.1, 92, 94.3, 56, 57, 94.1, 381/104
See application file for complete search history.

(56) References Cited

U.S. PATENT DOCUMENTS 5,568,559 A * 10/1996 Makino .......................... 381/98
7,171,008 B2 * 1/2007 Elko ............................... 381/92
7,174,023 B2 * 2/2007 Ozawa ......................... 381/94.1
2002/0041696 A1 * 4/2002 Jensen .......................... 381/317
2005/0074129 A1 * 4/2005 Fan ................................ 381/56
2005/0213778 A1 * 9/2005 Buck et al. .................... 381/94.3
2007/0030989 A1 * 2/2007 Kates ............................ 381/317
2008/0138043 A1 6/2008 Murabayashi et al.
2009/0175466 A1 * 7/2009 Elko et al. .................... 381/94.2

FOREIGN PATENT DOCUMENTS

JP 5-119794 5/1993
JP 5-308696 11/1993
JP 6-29764 2/1994
JP 6-311583 11/1994
JP 11-187478 7/1999

(Continued)

OTHER PUBLICATIONS

International Search Report for Application No. PCT/JP2007/074450; mailed Apr. 15, 2008.

(Continued)

*Primary Examiner* — Vivian Chin
*Assistant Examiner* — Con P Tran
(74) *Attorney, Agent, or Firm* — Staas & Halsey LLP

(57) ABSTRACT

A noise suppressing device includes: a suppressing unit for suppressing noise by subtracting a noise component derived on the basis of a plurality of sound signals output by a sound receiving unit from the sound signals; a variation deriving unit for deriving a degree of variation by numerically quantizing the variation on the basis of a spectrum obtained by converting the plurality of sound signals to components on a frequency axis; a determining unit for determining that wind noise is occurring due to wind blowing against the sound receiving units when the degree of variation is equal to or greater than a value; and an adjusting unit for adjusting an amount of suppression according to the decision of the determining unit; wherein the suppressing unit suppresses noise by subtracting the noise component from the sound signals based on the amount of suppression adjusted by the adjusting unit.

22 Claims, 14 Drawing Sheets

(56) References Cited

FOREIGN PATENT DOCUMENTS

| | | |
|---|---|---|
| JP | 3086539 | 7/2000 |
| JP | 2001-124621 | 5/2001 |
| JP | 3279612 | 2/2002 |
| JP | 3283423 | 3/2002 |
| WO | 2006/016605 | 2/2006 |

OTHER PUBLICATIONS

Japanese Office Action issued Sep. 4, 2012 in corresponding Japanese Patent Application No. 2009-546119.

* cited by examiner

NOISE SUPPRESSING DEVICE, NOISE SUPPRESSING CONTROLLER, NOISE SUPPRESSING METHOD AND RECORDING MEDIUM

CROSS-REFERENCE TO RELATED APPLICATIONS

This application is a continuation filed under U.S.C. §111 (a) of PCT International Application No. PCT/JP2007/074450, which has an international filing date of Dec. 19, 2007 and designated the United States of America

FIELD

The embodiments discussed herein are related to a noise suppressing device for suppressing noise in sound received by sound receiving units outputting a sound signal based on received sound, a noise suppressing controller for controlling the noise suppressing device, a noise suppressing method using the noise suppressing device and a recording medium storing a noise suppressing program for controlling the noise suppressing method.

BACKGROUND

The devices such as a microphone array including a plurality of sound receiving units using a microphone such as a condenser microphone outputting sound signal based on received sound and performing various acoustical signal processes based on the sound output by the sound receiving unit has been developed. Such device including a plurality of sound receiving units is capable of suppressing noise by performing processing such as "delay-and-sum" processing emphasizing a target sound by synchronizing each of the sound signals for each of the sound receiving units and adding the sound signals, and synchronized subtraction forming a dead zone for the noise source by synchronizing each of the sound signals and subtracting one from the other.

The noise suppressing device includes a main sound receiving unit and a sub sound receiving unit for generating a sound signal based on received sound, a delay unit for delaying the sound signals, a correcting unit for correcting the sound signals, and a subtracting unit for subtracting the sound signals. The main sound receiving unit and sub sound receiving unit are arranged along the arrival direction of sound from a speaker with adequate spacing, and the speaker produces sound from the side of the main sound receiving unit. The analog sound signals generated by the main sound receiving unit and the sub sound receiving unit are amplified, converted to digital signals, and furthermore converted to components on the frequency axis.

The delay unit delays the sound signal for the sub sound receiving unit by a delay time $\tau$, and outputs the delayed sound signal to the correcting unit. The delay time $\tau$ is based on the time required for arriving of the sound from the side of the sub sound receiving unit at the main sound receiving unit after the sound reached to the sub sound receiving unit. The level of the sound signal output from the sub sound receiving unit is matched to the level of the sound signal output from the main sound receiving unit including the correcting unit for correcting the delayed sound signal output from the sub sound receiving unit. The subtracting unit subtracts the corrected sound signal output for the sub sound receiving unit from the sound signal output for the main sound receiving unit. In this way, the noise suppressing device suppresses noise by performing synchronized subtraction of the sound signals and forming a directional dead zone on the side of the sub sound receiving unit.

When a disturbance such as wind blows against a noise suppressing device including a plurality of sound receiving units, wind noise is generated having characteristics in increasing of the level difference between the sound signals output by each of the sound receiving units, decreasing of the correlation between the sound signals, concentration of power on the low frequency region, disturbing of the phase difference spectrum between sound signals becomes disturbed and so on.

For example, due to the wind noise, the calculation of the correction value performed by a correction value calculating unit is disturbed so that the levels of the sound signals output from sub sound receiving unit become mismatched. Then abnormal conditions occurs, such as distortion of sound due to overcorrecting the level of the sound signal, or remaining noise due to under correcting the level of the sound signal. In addition, when wind blows against the sub sound receiving unit, the sound signal output by the sub sound receiving unit is subtracted from the sound signal output by main sound receiving unit. Then abnormal condition may occur such as generating of the component of the wind noise in the sound signal output from the sub sound receiving unit.

Techniques for suppressing wind noise are disclosed in Japanese Patent No. 3,086,539, Japanese Patent No. 3,283, 423 and Japanese Laid-open Patent Publication No. 116-311583. Moreover, a technique of determining the strength of the wind using two microphones is disclosed in Japanese Laid-open Patent Publication H5-308696.

SUMMARY

According to an aspect of the embodiments, a noise suppressing device being operable with a plurality of sound receiving units for outputting a plurality of sound signals based on received sound, and that suppresses noise in the sound received by the sound receiving units includes: a suppressing unit for suppressing noise by subtracting a noise component derived on the basis of the plurality of sound signals output by the sound receiving unit from the sound signals; a variation deriving unit for deriving a degree of variation by numerically quantizing the variation on the basis of a spectrum obtained by converting the plurality of sound signals to components on a frequency axis; a determining unit for determining that wind noise is occurring due to wind blowing against the sound receiving units when the degree of variation is equal to or greater than a specified variation threshold value; and an adjusting unit for adjusting an amount of suppression according to the decision of the determining unit about whether or not wind noise is occurring; wherein the suppressing unit suppresses noise by subtracting the noise component from the sound signals based on the amount of suppression adjusted by the adjusting unit.

The object and advantages of the invention will be realized and attained by the elements and combinations particularly pointed out in the claims. It is to be understood that both the foregoing general description and the following detailed description are exemplary and explanatory and are not restrictive of the embodiment, as claimed.

DESCRIPTION OF THE EMBODIMENTS

Embodiment 1

Figure 1:
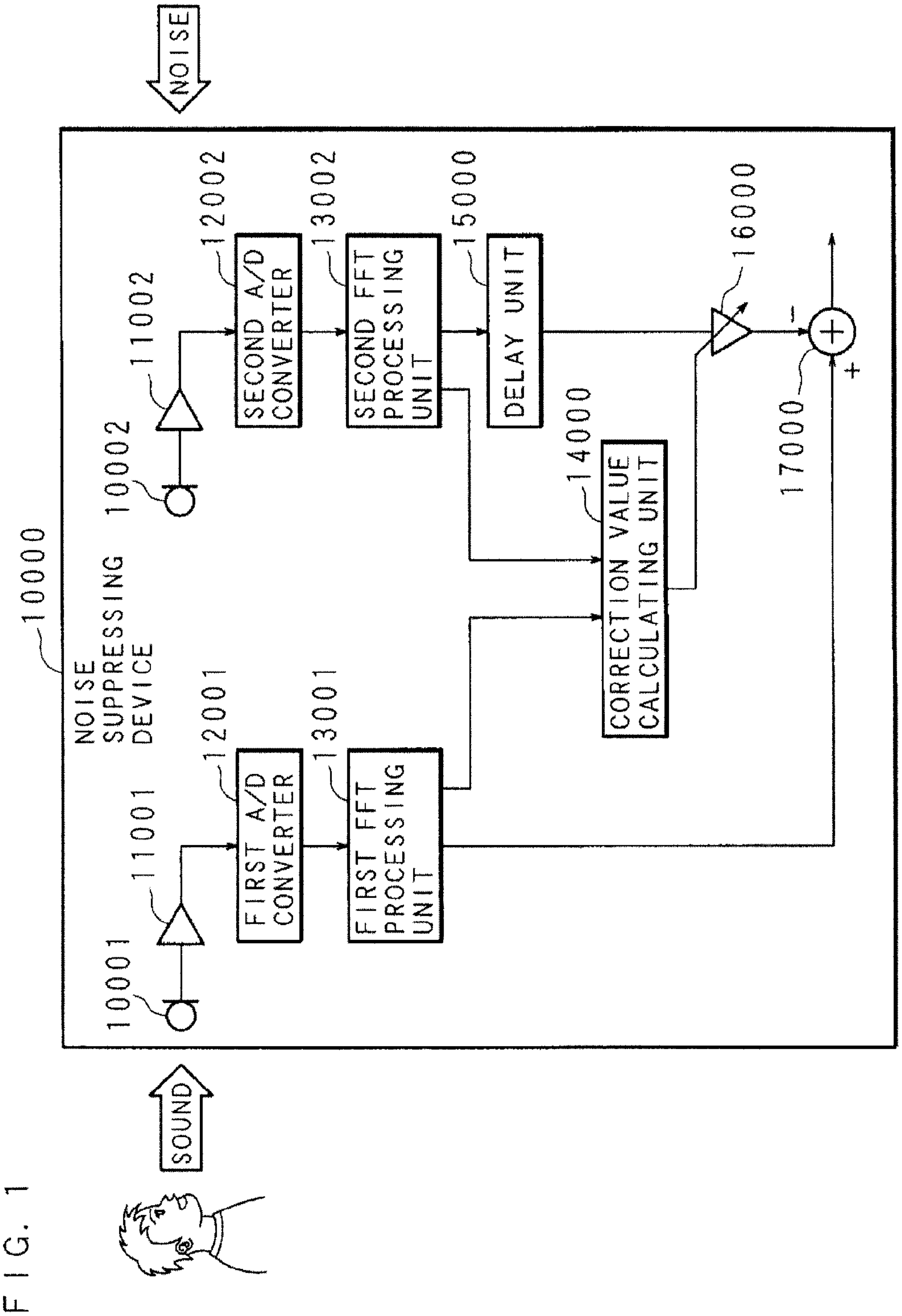
FIG. 1 is a function block diagram illustrating an example of a conventional noise suppressing device.

FIG. 1 is a function block diagram illustrating an example of a conventional noise suppressing device. In FIG. 1, 10000 is the noise suppressing device for suppressing noise by synchronized subtraction. The noise suppressing device 10000 includes a main sound receiving unit 10001 and sub sound receiving unit 10002 for generating a sound signal based on received sound, a first amplifier 11001 and second amplifier 11002 for amplifying sound signals, a first A/D (Analog-to-Digital) converter 12001 and a second A/D converter 12002 for performing A/D conversion of sound signals, a first FFT (Fast Fourier Transform) processing unit 13001 and a second FFT processing unit 13002 for performing FFT processing of sound signals, a correction value calculating unit 14000 for calculating a correction value in order to correct the sensitivity difference between the main sound receiving unit 10001 and sub sound receiving unit 10002, a delay unit 15000 for delaying sound signals, a correcting unit 16000 for correcting sound signals, and a subtracting unit 17000 for performing subtraction processing of sound signals. The main sound receiving unit 10001 and the sub sound receiving unit 10002 are arranged along the arrival direction of sound from a speaker with adequate spacing, and the speaker produces sound from the side of the main sound receiving unit 10001.

The analog sound signal generated by the main sound receiving unit 10001 is amplified by the first amplifier 11001, converted to a digital signal by the first A/D converter 12001 and furthermore converted to a component on the frequency axis by the first FFT processing unit 13001. Moreover, the analog sound signal generated by the sub sound receiving unit 10002 is amplified by the second amplifier 11002, converted to a digital signal by the second A/D converter 12002 and furthermore converted to a component on the frequency axis by the second FFT processing unit 13002.

The correction value calculating unit 14000 calculates a correction value based on the sound signals output from the main sound receiving unit 10001 and the sub sound receiving unit 10002 and converted to components on the frequency axis. Then, the correction value calculating unit 14000 outputs that calculated correction value to the correcting unit 16000. The delay unit 15000 delays the sound signal from the sub sound receiving unit 10002 by a delay time $\tau$, and outputs the delayed sound signal to the correcting unit 16000. The delay time $\tau$ is based on the time required for arriving of the sound from the side of the sub sound receiving unit 10002 at the main sound receiving unit 10001 after the sound reached the sub sound receiving unit 10002.

The correcting unit 16000 corrects the delayed sound signal from the sub sound receiving unit 10002 based on the correction value, and outputs the result to the subtracting unit 17000. The correction by the correcting unit 16000 matches the level of the sound signal from the sub sound receiving unit 10002 with the level of the sound signal from the main sound receiving unit 10001. The subtracting unit 17000 subtracts the corrected sound signal from the sub sound receiving unit 10002 from the sound signal output by the main sound receiving unit 10001. In this way, the noise suppressing device 10000 suppresses noise by performing synchronized subtraction of sound signals and forms a directional dead zone for the side of the sub sound receiving unit 10002.

When wind blows against the noise suppressing device 10000 including a plurality of sound receiving units as illustrated in FIG. 1, wind noise occurs having characteristics in increasing of the level difference between the sound signals output by each of the sound receiving units, decreasing of the correlation between the sound signals, concentration of power on the low frequency region, disturbing of the phase difference spectrum between sound signals becomes disturbed and so on.

For example, the wind noise disturbs the calculation of the correction value performed by a correction value calculating unit 14000 in the noise suppressing device 10000 illustrated in FIG. 1 so that the levels of the sound signals output from sub sound receiving unit 10002 become mismatched. Then abnormal conditions occurs, such as distortion of sound due to overcorrecting the level of the sound signal, or remaining noise due to under correcting the level of the sound signal. In addition, when wind blows against the sub sound receiving unit 10002, the sound signal output by the sub sound receiving unit 10002 is subtracted from the sound signal output by main sound receiving unit 10001. Then abnormal condition may occur such as generating of the component of the wind noise in the sound signal output from the sub sound receiving unit 10002.

Figure 2:
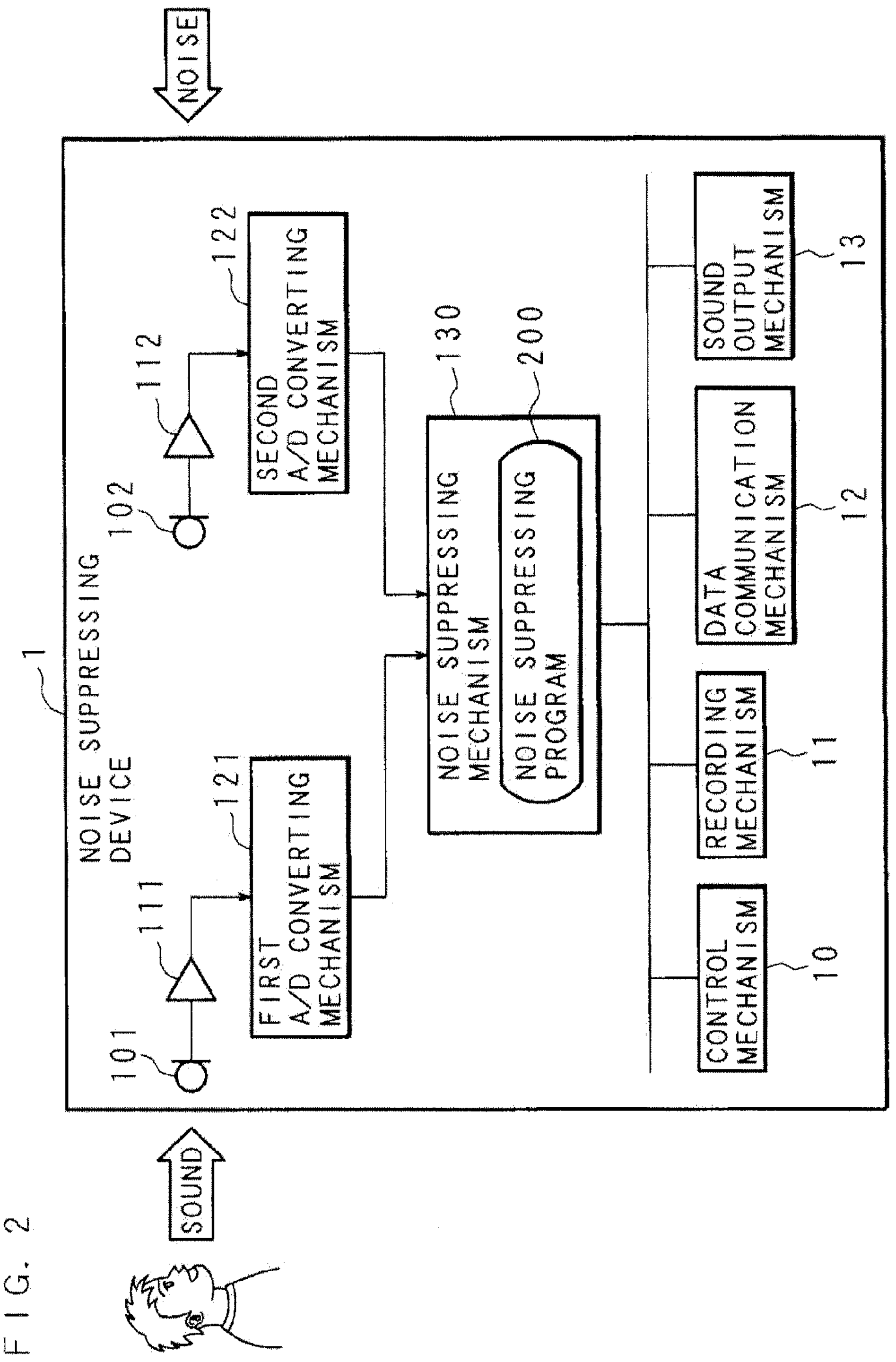
FIG. 2 is a block diagram illustrating an example of a noise suppressing device according to first embodiment.

FIG. 2 is a block diagram illustrating an example of a noise suppressing device according to the present embodiment. In FIG. 2, reference symbol 1 represents a noise suppressing device applied to a device such as a mobile telephone. The noise suppressing device 1 includes a main sound receiving mechanism 101, sub sound receiving mechanism 102 using a microphone such as a condenser microphone outputting a sound signal converted from a received sound, a first amplifier mechanism 111 and second amplifier mechanism 112 such as gain amplifier amplifying a sound signal, a first A/D converting mechanism 121 and second A/D converting mechanism 122 performing A/D conversion of a sound signal and a noise suppressing mechanism 130 such as DSP (Digital Signal Processor) storing a firmware such as the noise suppressing program 200 and data. In addition, by executing the noise suppressing program 200 installed in the noise suppressing mechanism 130 as a firmware, a computer included in the mobile telephone makes the mobile telephone function as the noise suppressing device 1.

Furthermore, the noise suppressing device 1 includes various mechanisms such as a control mechanism 10 such as a CPU (Central Processing Unit) controlling the device, a recording mechanism 11 such as ROM or RAM storing various programs and data, a communication mechanism 12 such as an antenna and attached equipment thereof, and a sound output mechanism 13 such as a loudspeaker outputting sound.

The main sound receiving mechanism 101 and the sub sound receiving mechanism 102 are located along the arrival direction of sound from an objective sound source such as the mouth of a speaker holding the mobile telephone, which is the noise suppressing device, with adequate spacing between them. The main sound receiving mechanism 101 is located on the side of the arrival direction of the vocal sound. The main sound receiving mechanism 101 and the sub sound receiving mechanism 102 generate an analog sound signal based on the respective received sound, and output the generated sound signal to a first amplifier mechanism 111 and second amplifier mechanism 112. The first amplifier mechanism 111 and second amplifier mechanism 112 amplify the input sound signals, and output the amplified sound signals to a first A/D converting mechanism 121 and second A/D converting mechanism 122. The first A/D converting mechanism 121 and second A/D converting mechanism 122 filter the sound signals by a filtering function such as a low pass filter (LPF), and perform sampling with a sampling frequency such as 8,000 Hz and 11,025 Hz to convert the sound signals to digital signals, then output the converted sound signals to the noise suppressing mechanism 130.

Figure 3:
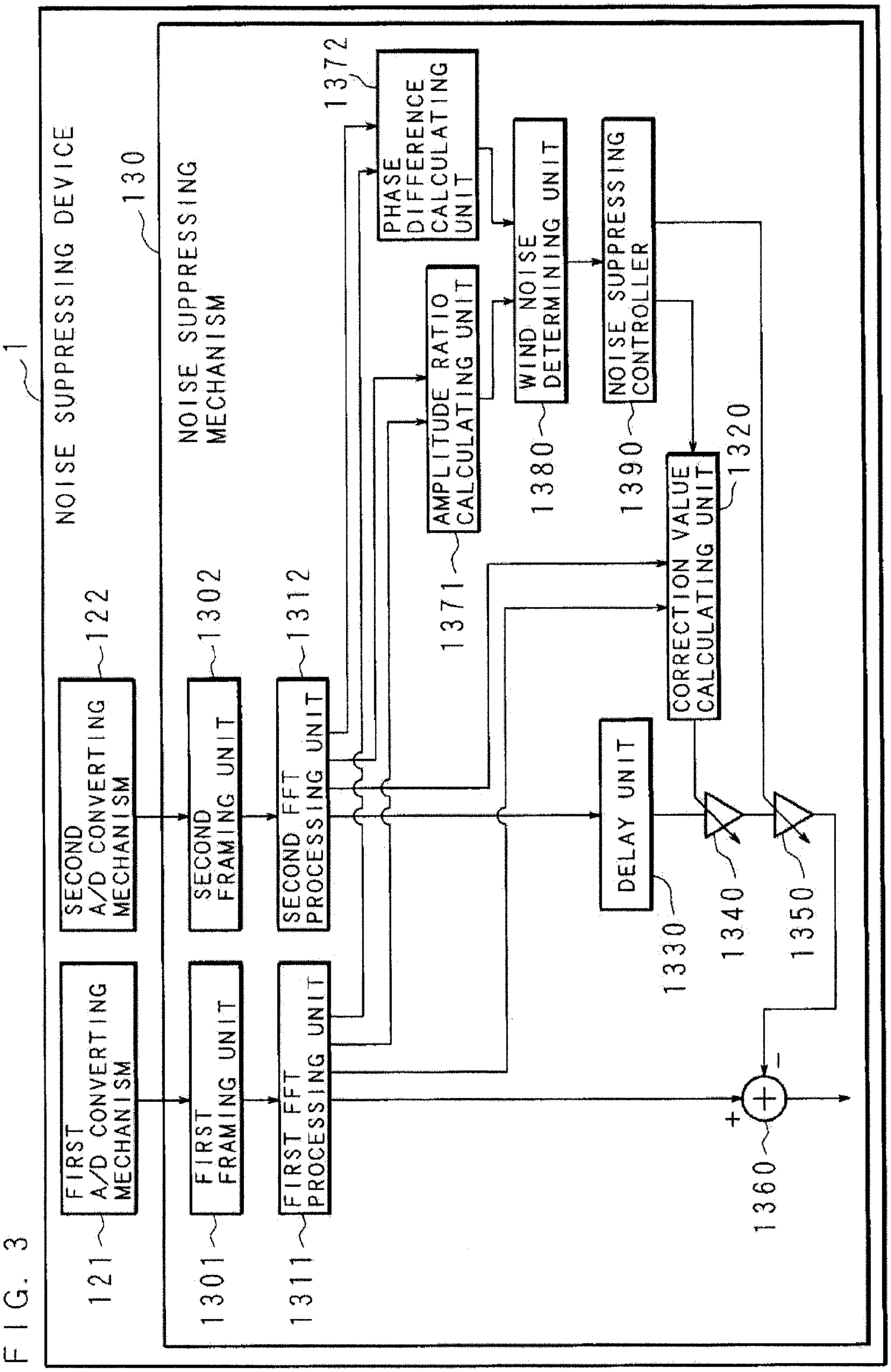
FIG. 3 is a function block diagram illustrating an example of the functional blocks of a noise suppressing mechanism included in the noise suppressing device of first embodiment.

FIG. 3 is a function block diagram of an example of the functions in the noise suppressing mechanism 130 of the noise suppressing device 1 of the present embodiment. The noise suppressing mechanism 130, by executing the noise suppressing program 200, functions as various program modules such as a first framing unit 1301 and a second framing unit 1302 for framing the sound signals, a first FFT processing unit 1311 and a second FFT processing unit 1312 for performing FFT processing on the sound signals, a correction value calculating unit 1320 for calculating a correction value to be used for correcting sensitivity difference of the main sound receiving unit 101 and sub sound receiving unit 102, a delay unit 1330 for delaying a sound signal, a correcting unit 1340 for correcting a sound signal, an adjusting unit 1350 for adjusting the amount of suppression of a sound signal, and a subtracting unit for subtracting a sound signal.

Moreover, the noise suppressing mechanism 130, by executing the noise suppressing program 200, functions as various program modules such as an amplitude ratio calculating unit 1371 for calculating the amplitude ratio of sound signals, a phase difference calculating unit 1372 for calculating the phase difference of sound signals, a wind noise determining unit 1380 for determining whether or not wind noise is occurring, and a noise suppressing controller 1390 for outputting a control signal to control the correction value calculating unit 1320 and adjusting unit 1350.

The signal processing performed on the sound signals by the various functions illustrated in FIG. 3 will be explained. The noise suppressing mechanism 130 receives digital signals from the first A/D converting mechanism 121 and second A/D converting mechanism 122. The first framing unit 1301 ad second framing unit 1302 receive the sound signals output from the first A/D converting mechanism 121 and second A/D converting mechanism 122, and frame the received sound signals in units of a specified length, such as 32 ms for example. Processing is performed while shifting each frame by a specified length such as 20 ms. In addition, conventional frame processing in the field of speech signal processing, for example window functions such as a hamming window or hanning window, and filtering by a high frequency emphasis filter (pre-emphasis filter), is performed on each frame.

The first FFT processing unit 1311 and the second FFT processing unit 1312, by performing FFT processing on the sound signals framed by the first framing unit 1301 and the second framing unit 1302, generate complex spectrum of sound signals converted to components on the frequency axis. The FFT processing is performed using 256 points of frequency.

The correction value calculating unit 1320 calculates a correction value based on the sound signal, to which the main sound receiving mechanism 101 and the sub sound receiving mechanism 102 output, converted to components on the frequency axis. The correction value is calculated by calculating the average value of the amplitude spectrum, which is the absolute values of the complex spectrum, for the sound signal from the main sound receiving mechanism 101 and the sound signal from the sub sound receiving mechanism 102, and then finding the ratio of the average values of the amplitude spectra. The difference between the average values of the amplitude spectra can be estimated to be the difference caused by the sensitivity difference between the main sound receiving mechanism 101 and the sub sound receiving mechanism 102, so by performing correction with this correction value, the sensitivity difference between the main sound receiving mechanism 101 and the sub sound receiving mechanism 102 is corrected. Moreover, the correction value calculating unit 1320 gives the calculated correction value to the correcting unit 1340.

The delay unit 1330 delays the sound signal from the sub sound receiving mechanism 102 by a delay time $\tau$. The delay time $\tau$ is based on the time required for arriving of noise from the side of the sub sound receiving mechanism 102 at the main sound receiving mechanism 101 after the noise reaches the sub sound receiving mechanism 102. In addition, the delay unit 1330 outputs the delayed sound signal from the sub sound receiving mechanism 102 to the correcting unit 1340.

The correcting unit 1340 performs correction by multiplying the delayed sound signal from the sub sound receiving unit 102 by the correction value. Due to the correction by the correcting unit 1340, the average value of the amplitude spectrum of the sound signal from the sub sound receiving mechanism 102 is matched to the average value of the amplitude spectrum of the sound signal from the main sound receiving mechanism 101. Moreover, the correcting unit 1340 outputs the corrected sound signal from the sub sound receiving mechanism 102 to the adjusting unit 1350. The sound signal through the adjusting unit 1350 becomes the amount of noise suppression to be used for synchronized subtraction because the level of the sound signal has been corrected based on the amplitude spectrum, and is synchronized with the sound signal from the main sound receiving mechanism 101 by delaying. When synchronized subtraction is performed based on the amount of suppression, the noise suppressing device 1 may achieve suppression in which a directional dead zone is formed on the side of the sub sound receiving mechanism 102.

The adjusting unit 1350 receives the sound signal concerning the sub sound receiving mechanism 102 from the correcting unit 1340 as the amount of noise suppression. The adjusting unit 1350 performs suitable adjustment for the received the amount of suppression based on a control signal received from the noise suppressing controller 1390. Moreover, the adjusting unit 1350 outputs the amount of suppression to the subtracting unit 1360.

The subtracting unit 1360 functions as a suppressing unit for suppressing noise by subtracting the amount of suppression, which is based on the sound signal from the sub sound receiving mechanism 102, from the sound signal from the main sound receiving mechanism 101. In addition, the subtracting unit 1360 outputs the sound signal from the main sound receiving mechanism 101 after noise suppression. For example, the subtracting unit 1360 outputs the sound signal to a communication mechanism 12, and that communication mechanism 12 transmits the sound signal as telephone communication. Moreover, the sound signal is output to a sound output mechanism 13, for example, and output from that sound output mechanism 13 as sound. When the subtracting unit 1360 outputs the sound signal, IFFT processing for converting the sound signal to a signal on the time axis, D/A (digital-to-analog) conversion for converting change the digitized sound signal to an analog signal, amplifying processing, and other various sound processing are performed as needed on the sound signal.

The amplitude ratio calculating unit 1371 derives an amplitude spectrum ratio for each frequency as a degree of variation of amplitude spectrum obtained by numerically quantizing variation of amplitude spectrum between sound signals on the basis of the amplitude spectrum of the sound signal from the main sound receiving mechanism 101 and the amplitude spectrum of the sound signal from the sub sound receiving mechanism 102. A power ratio spectrum may be used instead of the amplitude spectrum ratio.

$$|20\log_{10}(S1(\omega)/S2(\omega))| \qquad \text{Equation (1)}$$

ω: frequency,

S1(ω): an amplitude spectrum of the sound signal from the main sound receiving mechanism 101, and S2(ω) an amplitude spectrum of the sound signal from the sub sound receiving mechanism 102.

Furthermore, the amplitude ratio calculating unit 1371 outputs the derived degree of variation to the wind noise determining unit 1380.

The phase difference calculating unit 1372 derives the degree of variation by numerically quantizing the variation between frequencies of the phase difference in frame according to Equation (2) based on the phase-difference spectrum indicating the difference in the phase of the sound signal from the main sound receiving mechanism 101 and the phase of the sound signal from the sub sound receiving mechanism 102.

$$\frac{1}{\omega_3-\omega_2}\sum_{\omega_2}^{\omega_3}\phi(\omega)^2 \qquad \text{(Equation 2)}$$

In Equation (2), the Average Value of the Square of the Phase difference ϕ(ω) for frequencies ω0 to ω1 is derived. For example, a frequency of 100 Hz or less is used as the frequency ω0, and a frequency of 1,000 Hz is used as the frequency ω1. In addition, the phase difference calculating unit 1372 outputs the derived degree of variation to the wind noise determining unit 1380.

The wind noise determining unit 1380 compares the degree of variation received from the amplitude ratio calculating unit 1371 with a preset first threshold value 'α', and determines whether or not condition 1 given by Equation (3) below is satisfied.

$$|20\log_{10}(S1(\omega)/S2(\omega))|>\alpha \qquad \text{Equation (3)}$$

α: First threshold value

In conditions where wind noise is occurring, there is a tendency for either the sound signal from the main sound receiving mechanism 101 or the sound signal from the sub sound signal to become large easily. According to the tendency, the wind noise determining unit 1380 determines that wind noise is occurring when the degree of variation in the amplitude spectrum satisfies condition 1.

Moreover, the wind noise determining unit 1380 compares the degree of variation received from the phase difference calculating unit 1372 with a preset second threshold value 'β' and determines whether or not a condition 2 given by Equation (4) below is satisfied.

$$\frac{1}{\omega_3-\omega_2}\sum_{\omega_2}^{\omega_3}\phi(\omega)^2>\beta \qquad \text{(Equation 4)}$$

When Wind Noise is Occurring, an Abnormal Phase-Difference spectrum different from that of normal sound may occur. The wind noise determining unit 1380 determines that wind noise is occurring when the degree of variation of the phase-difference spectrum satisfies condition 2.

Figure 4A:
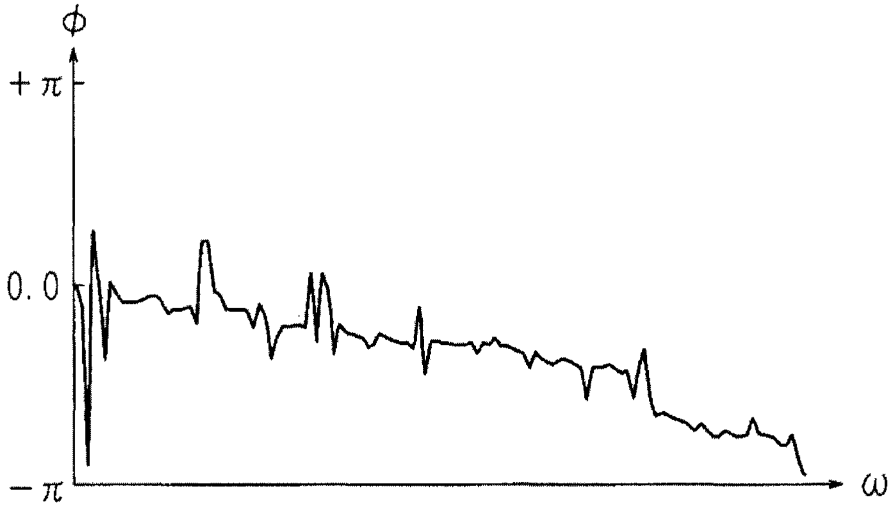
FIGS. 4A-4B are graphs representing an example of the relationship between the frequency and phase difference.
Figure 4B:
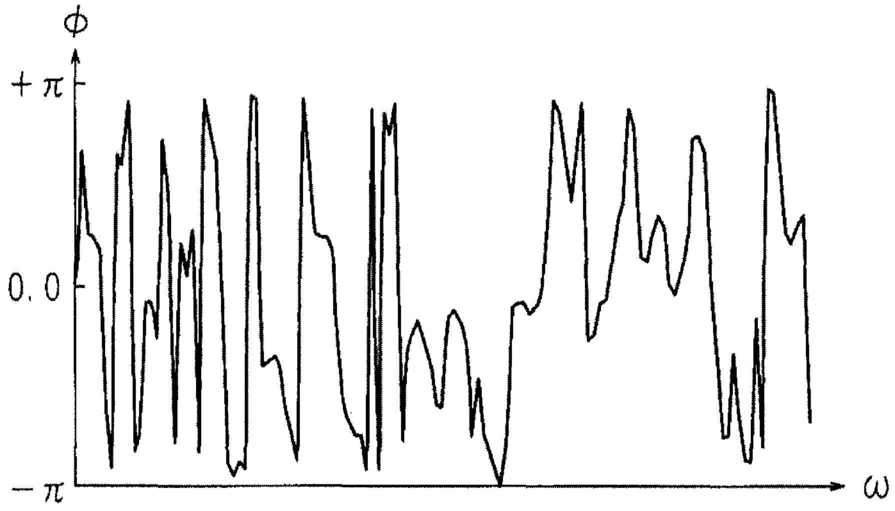

FIGS. 4A-4B illustrate graphs representing an example of the relationship between the frequency and the phase difference. The phase difference illustrated in FIGS. 4A-4B is obtained by subtracting the phase spectrum of the sound signal received from the main sound receiving mechanism 101 from the phase spectrum of the sound signal received from the sub sound receiving mechanism 102. In FIG. 4A represents the relationship between the frequency and phase difference when normal voice sound produced by a person is received, and FIG. 4B represents the relationship between the frequency and phase difference under conditions of wind noise. As illustrated in FIG. 4A, the phase difference of the case of normal voice sound, there are tendency that, passing through the origin of coordinates, the phase difference transitions along a line increasing in the negative direction the higher the frequency becomes. However, as illustrated in FIG. 4B, under conditions of wind noise, disturbance occurs in the phase difference over the entire band regardless of the frequency. In the case where a disturbance occurs in the phase-difference spectrum as illustrated in FIG. 4B, condition 2 given by Equation (4) is satisfied, so the wind noise determining unit 1380 determines that wind noise is occurring.

The wind noise determining unit 1380 determines whether or not wind noise occurs based on condition 1 and condition 2 described above. However, in the case of the degree of variation received from the amplitude ratio calculating unit 1371, when the level of one of the sound signals from the main sound receiving mechanism 101 and the sub sound receiving mechanism is extremely low and is approximately zero, the large value is taken, making it is easy for condition 1 given by Equation (3) to be established, and there is a high possibility that the wind noise determining unit 1380 will mistakenly determine that wind noise has occurred even though wind noise has not occurred.

Furthermore, in the relationship between the frequency and phase difference of the phase difference spectrum of ambient noise, variation occurs over a wide band, so when the level of the received sound is low and background noise is relatively large, condition 2 given by Equation (4) is easily established, and there is a high possibility that the wind noise determining unit 1380 will mistakenly determine that wind noise has occurred even though wind noise has not occurred.

Figure 5:
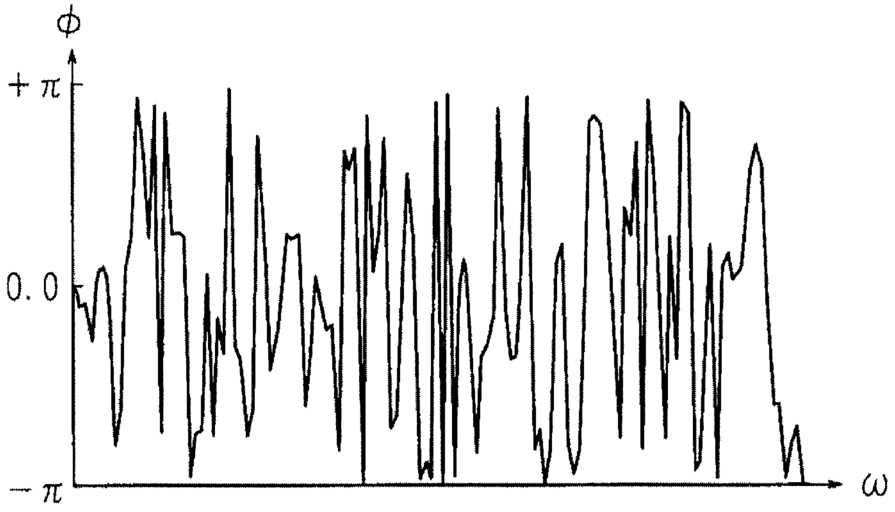
FIG. 5 is a graph representing an example of the relationship between the frequency and phase difference.

FIG. 5 is a graph representing an example of the relationship between the frequency and phase difference. FIG. 5 represents that relationship with the frequency ω along the horizontal and the phase difference in radian units along the vertical axis. FIG. 5 represents the relationship between the frequency and phase difference of background noise, and is similar to the relationship under a condition of noise that is illustrated in FIG. 4B, where disturbance of the phase difference spectrum occurs over the entire band. Therefore, in condition 2 given by Equation (4), there is a possibility that background noise will be mistakenly determined to be noise.

Therefore, when determining the occurrence of wind noise according to condition 1 and condition 2, a condition 3 is set as given in Equation (5). When condition 3 is not satisfied, the wind noise determining unit 1380 determines that wind noise is not occurring.

$$\frac{1}{\omega_1-\omega_0}\sum_{w_0}^{\omega_1}S_1(\omega)^2>\gamma\frac{1}{\omega_1-\omega_0}\sum_{\omega_0}^{\omega_1}S_2(\omega)^2>\gamma \quad \text{[Equation 5]}$$

Equation (5) derives the square of the amplitude at a frequency ω2 to ω3, or in other words, the average value of the power, and when the derived average value of the power is equal to or greater than a third preset threshold value γ, defines a condition 3 in which there is a possibility that wind noise is occurring. By setting condition 3, it is possible to prevent mistakes in determination when one of the sound signals is extremely low. It also becomes possible to prevent mistakes in determination when the level of a received sound is low and background noise becomes relatively large. A frequency of 100 Hz or less, for example, is used as ω2, and a frequency of 3400 Hz, for example, is used as ω3.

The wind noise determining unit 1380 presumes that condition 3 is satisfied, and determines whether or not wind noise is occurring based on the logical AND or logical OR of condition 1 and condition 2. In other words, the wind noise determining unit 1380 determines that wind noise is occurring, when condition 1 and condition 2 are satisfied, and furthermore condition 3 is satisfied, on condition that logical AND is set as a determining condition. The wind noise determining unit 1380 determines wind noise is not occurring when any one of the conditions, condition 1 and condition 2 and condition 3 is not satisfied, on condition that logical AND is set as a determining condition. Moreover, the wind noise determining unit 1380 determines that wind noise is occurring when condition 1 or condition 2 is satisfied, and furthermore condition 3 is satisfied, on condition that a logical OR is set as the determining condition. The wind noise determining unit 1380 determines that wind noise is not occurring when both condition 1 and condition 2 are not satisfied, or condition 3 is not satisfied, on condition that a logical OR is set as the determining condition. In addition, the wind noise determining unit 1380 gives the determining result of whether or not there is wind noise to the noise suppressing controller 1390.

The noise suppressing controller 1390 gives a control signal to the correction value calculating unit 1320 and adjusting unit 1350 based on the determining result of whether or not there is wind noise. The control signal that is given to the correction value calculating unit 1320 is a '1' or '0' signal indicating whether or not it is necessary to calculate a correction value based on whether or not wind noise is occurring. When it is determined that wind noise is not occurring, the noise suppressing controller 1390 gives a '1' signal in order to calculate and update the correction value. When it is determined that wind noise is occurring, the noise suppressing controller 1390 gives a '0' signal in order to stop updating the correction value. When it is determined that wind noise is occurring, by performing control to stop updating the difference in the average value of the amplitude spectrum for correcting the sensitivity difference between the main sound receiving mechanism 101 and sub sound receiving mechanism 102, the noise suppressing controller 1390 prevents the correction value of the sensitivity difference from becoming disturbed.

As was described above, the correction value calculating unit 1320 derives a correction value based on the difference between average values and gives the derived correction value to the correcting unit 1340, however, when a '0' control signal is received, stops updating the difference between average values and stops updating the correction value. Due to updating or stopping of the correction value of the sensitivity difference by giving a control signal to the correction value calculating unit 1320 from the wind noise determining unit 1380 in this way, it is possible to adjust the amount of noise suppression.

The control signal given by the noise suppressing controller 1390 to the adjusting unit 1350 is a '1.0'. '0.8', '0.6', '0.4', '0.2' or '0.0' class signal performing stepwise control of the amount of suppression. The wind noise determining unit 1380 has a counter (not shown in the figure) outputting an integer value of N=0 to 5. The initial value of the counter is N=0, and when it is determined, for example, that wind noise is occurring, the counter increases by '1'. When it is determined, for example, that wind noise is not occurring, the counter decreases by '1'. In addition, when the counter value N is '0', the wind noise determining unit 1380 gives the class signal '1.0' to the adjusting unit 1350, when the counter value N is '1', gives the class signal '0.8', when the counter value N is '2', gives the class signal '0.6', when the counter value N is '3', gives the class signal '0.4', when the counter value N is '4', gives the class signal '0.2', and when the counter value N is '5', gives the class signal '0.0', respectively. The value of the class signal is a multiplier by which the output of the correcting unit 1340 is multiplied, and the adjusting unit 1350 adjusts the amount to suppress the noise by performing multiplication with this multiplier that is based on the class signal. That is, when it is determined for five continuous frames that wind noise is occurring, the amount of suppression becomes '0.0', or in other words, suppression is not performed. When it is determined for five continuous frames from this state that wind noise is not occurring, the amount of suppression becomes 1.0, or in other words the amount of suppression returns to the normal amount of suppression for noise. Suppression may be performed by giving signals '1' or '0' to the adjusting unit 1350 as control signals, however, by performing stepwise adjustment as class signals, it becomes possible to prevent sudden change in the amount of suppression and to output sound with no unpleasant feeling.

As described above, the adjusting unit 1350 receives the sound signal from the sub sound receiving mechanism 102 from the correcting unit 1340 as a sound signal time-synchronized with the noise signal, and further receives a control signal representing the multiplier from the wind noise determining unit 1380. Moreover, the adjusting unit 1350 multiplies the sound signal time-synchronized with the noise by a multiplier as a control signal, then gives the sound signal time-synchronized with the noise to the subtracting unit 1360.

As described above, when suppressing the noise of the sound signal from the main sound receiving mechanism 101, the noise suppressing device 1 adjusts the amount of suppression according to the wind noise.

Figure 6:
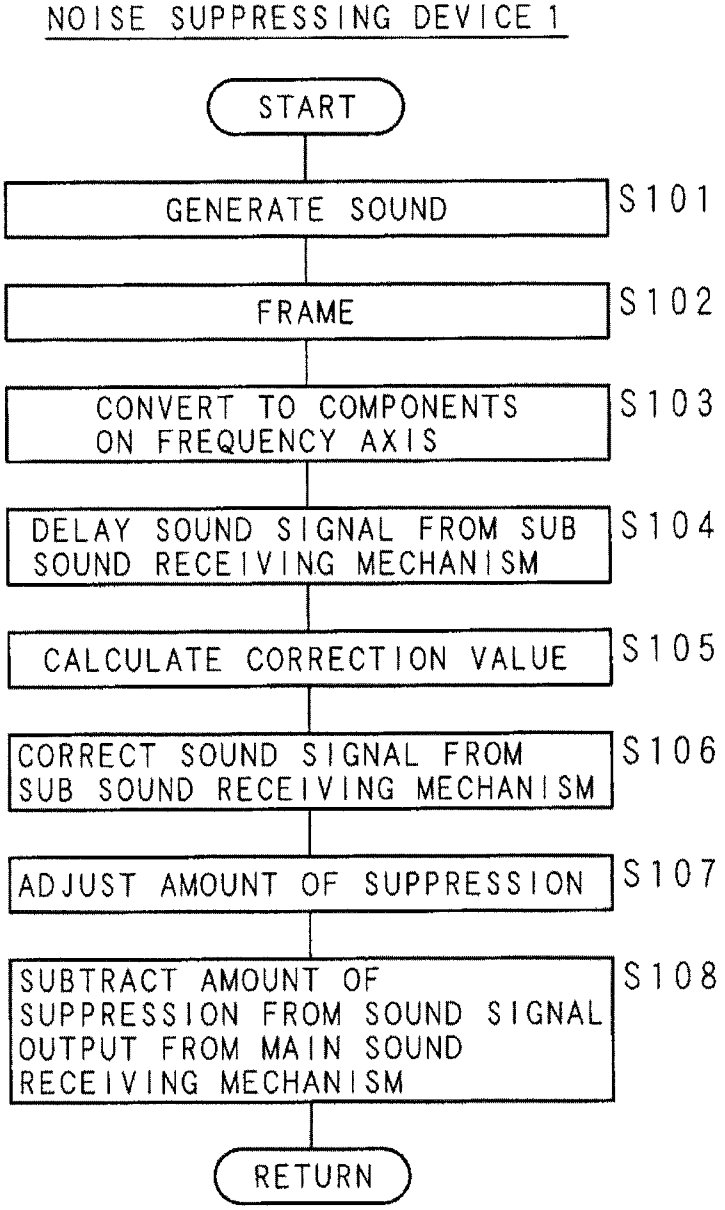
FIG. 6 is an operation chart illustrating an example of the noise suppressing process of the noise suppressing device of first embodiment.

Next, the processing by the noise suppressing device of the present embodiment will be explained. FIG. 6 is an operation chart illustrating an example of the noise suppressing process performed by the noise suppressing device 1 in the first embodiment. The noise suppressing device 1 receives arriving sounds from both a main sound receiving mechanism 101 and sub sound receiving mechanism 102, creates analog sound signals for each based on the received sounds (at the operation S101), and outputs each of the created sounds to a first amplification mechanism 111 and second amplification mechanism 112.

The noise suppressing device 1 amplifies each of the inputted sound signals via a first amplification mechanism 111 and a second amplification mechanism 112, converts each of the sound signals to digital signals via a first A/D converting mechanism 121 and a second A/D converting mechanism 122, and outputs the sounds signals converted to digital signals to a noise suppressing mechanism 130.

The noise suppressing mechanism 130 of the noise suppressing device 1 frames each of the inputted sound signals via a first framing unit 1301 and a second framing unit 1302 (at the operation S102), and converts the framed sound signals to sound signals of components on the frequency axis via a first FFT processing unit 1311 and a second FFT processing unit 1312 (at the operation S103). At the operation S103, FFT does not absolutely have to be used as the method for converting the sound signals to components on the frequency axis, and other frequency conversion methods, such as DCT (Discrete Cosine Transform) may also be used.

The noise suppressing mechanism 130 of the noise suppressing device 1 causes delay of delay time $\tau$ in the sound signal from the sub sound receiving mechanism 102 by a delay unit 1330, the sound signal converted to a component on the frequency axis (at the operation S104).

The noise suppressing mechanism 130 of the noise suppressing device 1 calculates a correction value by a correction value calculating unit 1320 based on the sound signal from the main sound receiving mechanism 101 and the sound signal from the sub sound receiving mechanism 102, the both of the sound signals converted to components on the frequency axis (at the operation S105). At the operation S105, the correction value calculating unit 1320 stops updating the correction value when a '0' control signal indicating that wind noise is occurring is received from a wind noise determining unit 1380.

The noise suppressing mechanism 130 of the noise suppressing device 1 performs correction by multiplying the sound signal from the sub sound receiving mechanism 102, the sound signal received from the delay unit 1330 by the correction value received from the correction value calculating unit 1320 (at the operation S106), and gives the corrected sound signal from the sub sound receiving mechanism 102 to an adjusting unit 1350 as the amount of suppression to suppress noise.

The noise suppressing mechanism 130 of the noise suppressing device 1 adjusts the amount of suppression by the adjusting unit 1350 through synchronized subtraction based on a control signal received from a noise suppressing controller 1390 (at the operation S107).

The noise suppressing mechanism 130 of the noise suppressing device 1, by the subtracting unit 1360, subtracts the sound signal, for which the amount of suppression was adjusted, time-synchronized with the noise, from the sound signal from the main sound receiving unit 101 (at the operation S108). Through the subtraction at the operation S108, the noise of the sound signal from the main sound receiving mechanism 101 is suppressed. Moreover, the subtracting unit 1360 outputs the sound signal from the main sound receiving mechanism 101 after noise suppression.

Figure 7:
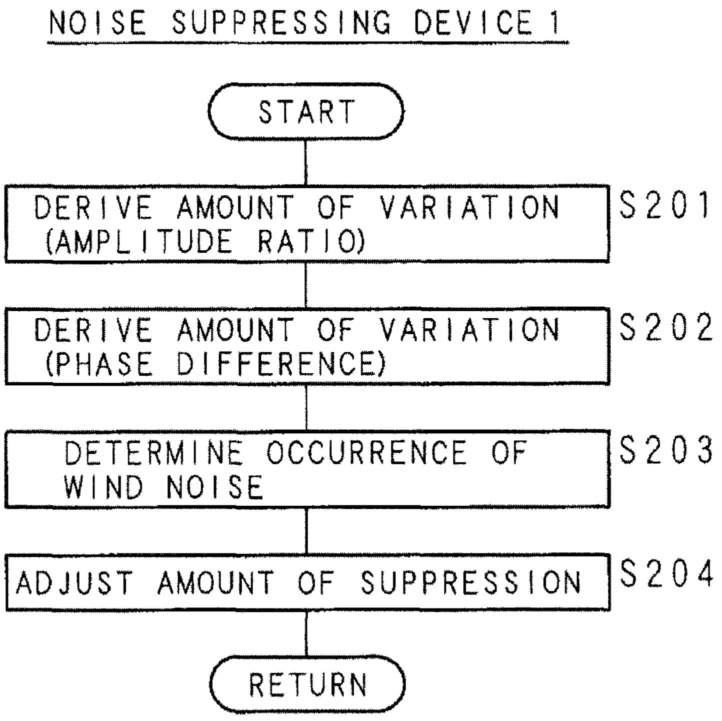
FIG. 7 is an operation chart illustrating an example of the amount of suppression control process of the noise suppressing device of first embodiment.

FIG. 7 is an operation chart illustrating the amount of suppression control process by the noise suppressing device 1 of the present embodiment. The noise suppressing device 1 executes the amount of suppression control process at the same time as the noise suppressing process. The noise suppressing mechanism 130 of the noise suppressing device 1, by the amplitude ratio calculating unit 1371, derives the amplitude ratio as a degree of variation based on the sound signal from the main sound receiving mechanism 101 and the sound signal from the sub sound receiving mechanism 102 (at the operation S201).

The noise suppressing mechanism 130 of the noise suppressing device 1, by the phase difference calculating unit 1372, derives the degree of variation indicating the variation of the phase difference based on the sound signal from the main sound receiving mechanism 101 and the sound signal from the sub sound receiving mechanism 102 (at the operation S202). The processing at the operations S201 and S202 is essentially performed at the same time.

The noise suppressing mechanism 130 of the noise suppressing device 1, by the wind noise determining unit 1380, determines whether or not wind noise is occurring due to blowing wind based on a comparison of a preset first threshold value, second threshold value and third threshold value (at the operation S203), and gives the determining result of whether or not there is wind noise to the noise suppressing controller 1390.

The noise suppressing mechanism 130 of the noise suppressing device 1, by the noise suppressing controller 1390, adjusts the amount of suppression by giving control signals to the correction value calculating unit 1320 and adjusting unit 1350 adjusting the amount of suppression according to the determining result of whether or not there is wind noise (at the operation S204).

In this way, the noise suppressing device 1 of the present embodiment detects the occurrence of wind noise with high accuracy regardless of ambient noise, and adjusts the amount to suppress the ambient noise.

When wind noise occurs, the noise suppressing device 1 of the present embodiment performs highly-precision detection even under conditions of other ambient noise by detecting the occurrence of wind noise based on the characteristic that variation occurs such as variation between frequencies of the phase difference of a plurality of sound signals based on the phase spectrum, or variation of amplitude between a plurality of sound signals based on the amplitude spectrum.

The noise suppressing device 1 of the present embodiment eliminates the effect of noise in low-frequency regions where power is concentrated under conditions in which wind noise occurs.

Embodiment 2

A second embodiment is an example of further suppression of the wind noise component after the suppression of ambient noise in the first embodiment. In the following explanation, for same parts as that of the first embodiment, the same reference numbers will be used as in the description of the first embodiment, and a detailed explanation will be omitted.

Figure 8:
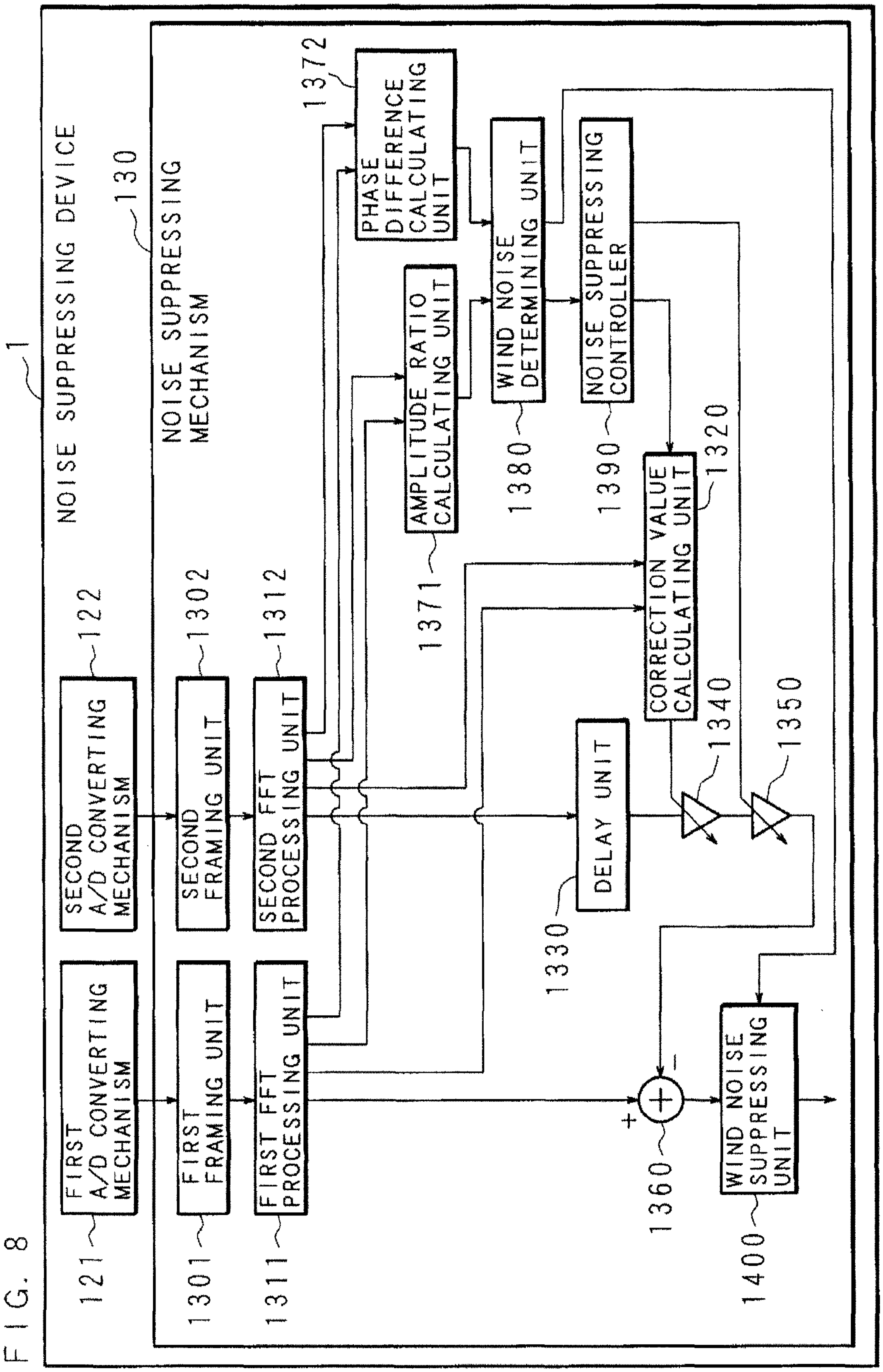
FIG. 8 is a function block diagram illustrating an example of functions of the noise suppressing mechanism included in the noise suppressing device according to second embodiment.

An example the noise suppressing device 1 of second embodiment is the same as that of the first embodiment, so with the first embodiment as a reference, an explanation is omitted. FIG. 8 is a function block diagram illustrating an example of the functions of the noise suppressing mechanism 130 of the noise suppressing device 1 of the present embodiment. By executing a noise suppressing program 200, the noise suppressing mechanism 130 generates various program modules such as a first framing unit 1301, a second framing unit 1302, a first FFT processing unit 1311, a second FFT processing unit 1312, a correction value calculating unit 1320, a delay unit 1330, a correcting unit 1340, an adjusting unit 1350 and a subtracting unit 1360.

In addition, by executing the noise suppressing program 200 in FIG. 2, the noise suppressing mechanism 130 generates various program modules such as an amplitude ratio calculating unit 1371, a phase difference calculating unit 1372, a wind noise determining unit 1380, a noise suppressing controller 1390 and a wind noise suppressing unit 1400 for suppressing the wind noise component.

Sound processing of sound signals by each of the various functions illustrated in FIG. 8 will be explained. In the present embodiment, signal processing by the first framing unit 1301, the second framing unit 1302, the first FFT processing unit 1311, second FFT processing unit 1312, the correction value calculating unit 1320, the delay unit 1330, the correcting unit 1340, the adjusting unit 1350, the amplitude ratio calculating unit 1371, the phase difference calculating unit 1372 and the noise suppressing controller 1390 is the same as in first embodiment, so with the first embodiment as a reference, an explanation thereof is omitted.

The subtracting unit 1360 gives the sound signal from the main sound receiving mechanism 101 after noise suppression to the wind noise suppressing unit 1400.

The wind noise determining unit 1380 gives the determining result of whether or not there is wind noise to the noise suppressing controller 1390 and wind noise suppressing unit 1400.

The wind noise suppressing unit 1400 suppresses wind noise by reducing the low frequency component specified frequency or less from the sound signal from the main sound receiving unit 101 after noise suppression based on the determining result of whether or not there is wind noise. In other words, when it is determined that wind noise is occurring, the wind noise suppressing unit 1400 suppresses the wind noise by a applying suppression gain having a specified slope to the low frequency component that is a specified frequency, for example, 2000 Hz or less, based on the characteristic that wind noise affects the low frequency component.

A counter (not shown in the figure) outputting integer values M=0 to 5 is provided in the wind noise suppressing unit 1400. The initial value of the counter is M=0. When it is determined, for example, that wind noise is occurring, the counter value M is increased by ‘1’. When it is determined that wind noise is not occurring, the counter value M is decreased by ‘2’. In addition, the wind noise suppressing unit 1400 changes the amount of suppression for suppressing the wind noise in steps according to the counter value M. By performing stepwise adjustment of the amount of suppression for wind noise, it is possible to prevent sudden changes in the sound signal, and thus output sound with no unpleasant feeling is possible.

Figure 9:
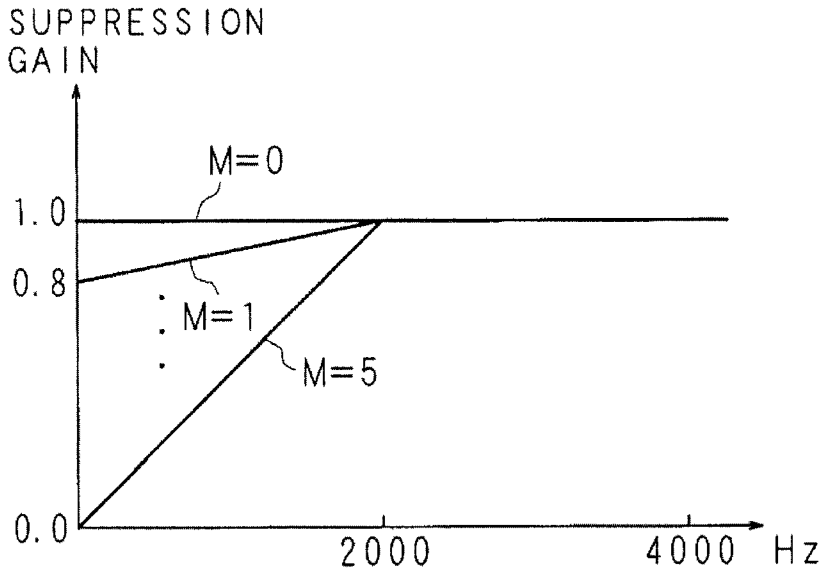
FIG. 9 is a graph representing an example of suppressing wind noise by a wind noise suppressing unit of the noise suppressing mechanism included in the noise suppressing device according to second embodiment.

FIG. 9 is a graph representing an example of suppressing wind noise by the wind noise suppressing unit 1400 of the noise suppressing mechanism 130 of the noise suppressing device 1 of the present embodiment. FIG. 9 represents the relationship between the frequency ω, which is represented along the horizontal axis, and the suppression gain, which is represented along the vertical axis. As represented in FIG. 9, when the counter value M=0, the suppression gain is 1.0 over the entire frequency band, so essentially the wind noise suppressing unit 1400 does not perform suppression. When the counter value M becomes M=1 by detecting the occurrence of wind noise, the wind noise suppressing unit 1400 applies a suppression gain to the sound signal having a slope where at 0 Hz the suppression gain is 0.8 and at the specified frequency of 2000 Hz is 1.0. Moreover, the slope of the gain increases as the counter value M increases, so when the counter value M=5, the wind noise suppressing unit 1400 applies a suppression gain to the sound signal having a slope where at 0 Hz the suppression gain is 0.0 and at the specified frequency of 2000 Hz is 1.0.

In addition, the wind noise suppressing unit 1400 outputs the sound signal from the main sound receiving unit 101 after suppressing of the noise component. The sound signal, for example, is output to a communication mechanism 12, and then transmitted from the communication mechanism 12 as telephone communication. Moreover, the sound signal, for example, is output to a sound output mechanism 13, and output from the sound output mechanism 13 as sound. When outputting the sound signal from the subtracting unit 1360, various acoustical signal processing, such as IFFT processing for converting the sound signal to a signal on the time axis, D/A conversion for converting the digitized sound signal to an analog signal, and amplification processing, is performed on the sound signal as needed.

In present embodiment, a noise suppressing device 1 is realized that further suppresses the wind noise component after the noise of the sound signal from the main sound receiving mechanism 101 has been suppressed. The method of suppressing wind noise described above is just one example, and the embodiment is not limited to the wind noise suppression method described above.

Figure 10:
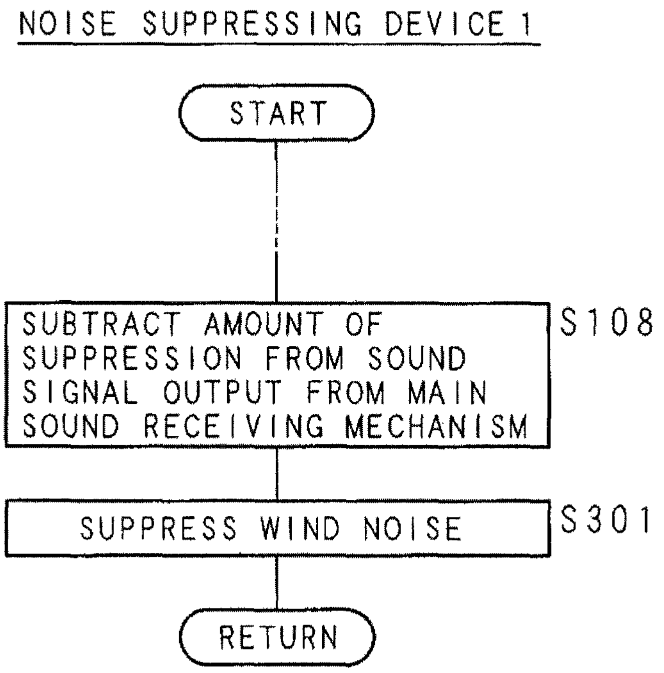
FIG. 10 is an operation chart illustrating an example of the noise suppressing process of the noise suppressing device according to second embodiment.

Next, the processing by the noise suppressing device 1 of the present embodiment will be explained. FIG. 10 is an operation chart illustrating an example of the noise suppressing processing by the noise suppressing device 1 of the present embodiment. In the present embodiment, after executing the processing of operations S101 to S108 presented in the operation chart of the noise suppressing processing of the first embodiment, the wind noise suppressing unit 1400 of the noise suppressing mechanism 130 executes processing to suppress the wind noise component.

The noise suppressing device 1 executes the processing at the operations 5101 to S108 described for the first embodiment. Moreover, the noise suppressing mechanism 130 of the noise suppressing device 1, via the wind noise suppressing unit 1400, suppresses the wind noise by decreasing the low frequency component that is a specified frequency or less from the sound signal from the main sound receiving mechanism 101 after noise suppression based on the determining result of whether or not there is wind noise (at the operation S301). In addition, the wind noise suppressing unit 1400 outputs the sound signal from the main sound receiving mechanism 101 after noise suppression.

The amount of suppression control process by the noise suppressing device 1 of the present embodiment is the same as that described for the first embodiment, so with the first embodiment as a reference, an explanation thereof is omitted.

In the amount of suppression control process of the present embodiment, the noise suppressing mechanism 130 of the noise suppressing device 1, by the wind noise determining unit 1380, gives the determining result of whether or not there is wind noise to the noise suppressing controller 1390 as well as to the wind noise suppressing unit 1400.

In this way, the noise suppressing device 1 of the present embodiment suppresses the wind noise component according to the occurrence status of wind noise.

The noise suppressing device 1 of the present embodiment prevents sudden change in the sound signal after noise suppression.

Embodiment 3

A third embodiment is an example in which in the first embodiment, the arrival direction of the noise direction is estimated, and the delay time is adaptively updated based on the estimated arrival direction. In the following explanation, for the parts same as that described for the first embodiment, the same reference numbers that were used in the first embodiment will be used, and any detailed explanation will be omitted.

Figure 11:
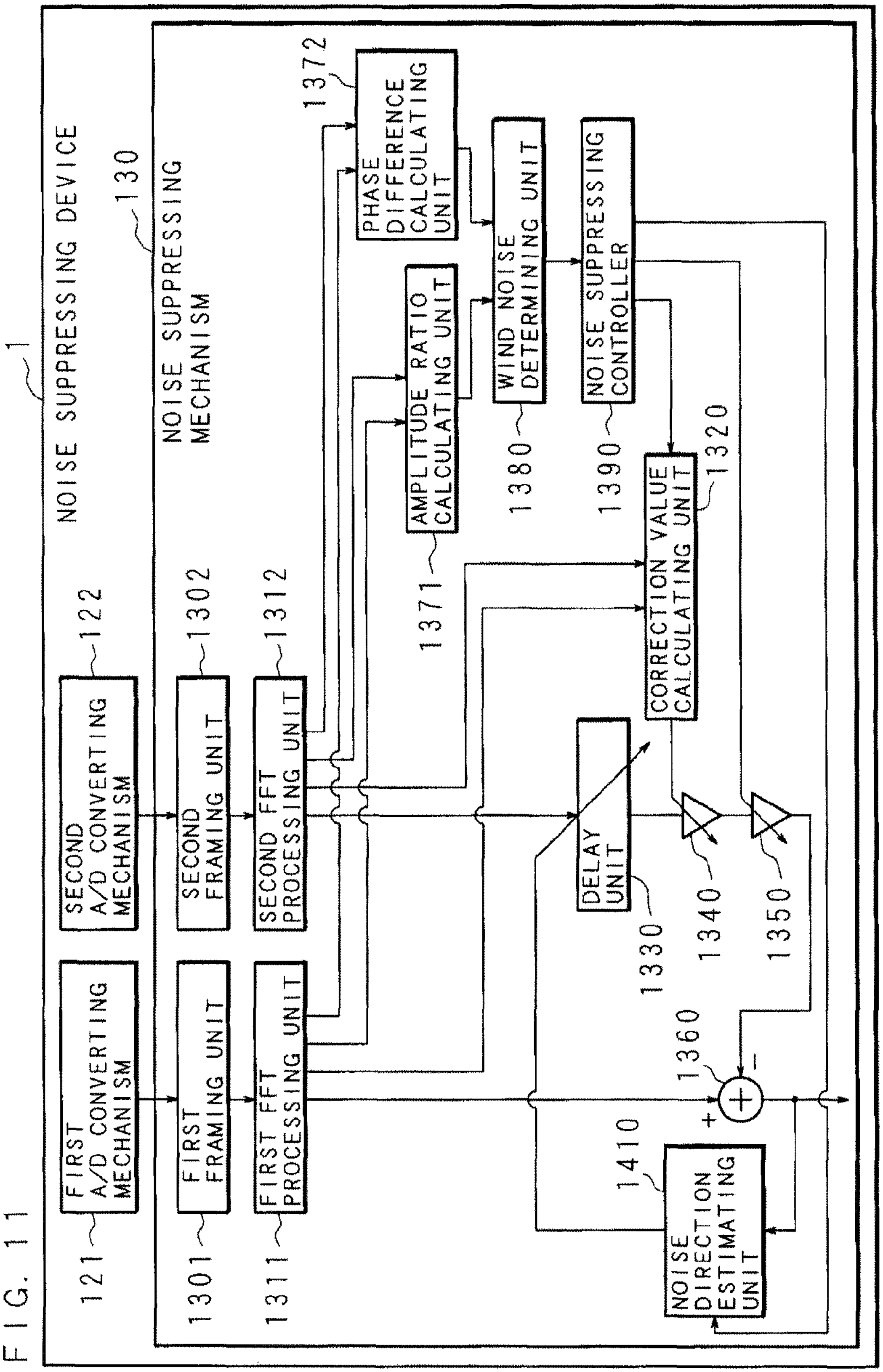
FIG. 11 is a function block diagram illustrating an example of the functions of the noise suppressing mechanism included in the noise suppressing device according to third embodiment.

An example of the noise suppressing device 1 of the present embodiment is the same as that of the first embodiment, so with embodiment 1 as a reference, an explanation thereof is omitted. FIG. 11 is a function block diagram illustrating of an example of the functions of a noise suppressing mechanism 130 of the noise suppressing device 1 of the present embodiment. By executing a noise suppressing program 200, the noise suppressing mechanism 130 generates various program modules such as a first framing unit 1301, a second framing unit 1302, a first FFT processing unit 1311, a second FFT processing unit 1312, a correction value calculating unit 1320, a delay unit 1330, a correcting unit 1340, an adjusting unit 1350 and a subtracting unit 1360.

In addition, by executing the noise suppressing program 200, the noise suppressing mechanism 130 generates various program modules such as an amplitude ratio calculating unit 1371, a phase difference calculating unit 1372, a wind noise determining unit 1380, a noise suppressing controller 1390 and a noise direction estimating unit 1410 for estimating the arrival direction of noise.

The signal processing that is performed on sound signals by the various functions illustrated in FIG. 11 will be explained. In the present embodiment, each signal processing by the first framing unit 1301, the second framing unit 1302, the first FFT processing unit 1311, the second FFT processing unit 1312, the correction value calculating unit 1320, the correcting unit 1340, the adjusting unit 1350, the amplitude ratio calculating unit 1371, the phase difference calculating unit 1372 and the wind noise determining unit 1380 is the same as that described for the first embodiment, so with the first embodiment as a reference, an explanation thereof is omitted.

The noise suppressing controller 1390 gives control signals based on the determining result of whether or not there is wind noise to the correction value calculating unit 1320, adjusting unit 1350 and noise direction estimating unit 1410. The control signal given to the noise direction estimating unit 1410 is a signal indicating whether or not there is wind noise.

The subtracting unit 1360, together with performing output based on the sound signal from the main sound receiving mechanism 101 after noise suppression, gives that sound signal to the noise direction estimating unit 1410.

The noise direction estimating unit 1410, by changing the delay time τ of the delay unit 1330 in just the period of the ambient noise, searches for a delay time τ for which the power of the sound signal from the main sound receiving mechanism 101 that was received from the subtracting unit 1360 become a minimum and identifies the delay time τ when the power becomes a minimum. By adaptively identifying and setting the delay time τ where the power becomes a minimum, the noise direction estimating unit 1410 estimates the arrival direction of the ambient noise so that a dead zone may be formed in the estimated direction. Moreover, based on that estimated direction, the noise direction estimating unit 1410 forms a reference point for suppressing ambient noise. Various processing that has been developed as an adaptive array may be applied as the process for estimating the arrival direction of ambient noise by changing the delay time τ.

However, when the control signal received from the noise suppressing controller 1390 is a signal indicating that wind noise is not occurring, the noise direction estimating unit 1410 continues to estimate the arrival direction of ambient noise by identifying the delay time τ. However, when the control signal is a signal indicating that wind noise is occurring, stops estimation of the arrival direction of ambient noise by identifying the delay time τ.

Moreover, the noise direction estimating unit 1410 gives the identified delay time τ to the delay unit 1330. However, when wind noise is occurring, the noise direction estimating unit 1410 gives the previously identified delay time τ. When wind noise is occurring, the noise direction estimating unit 1410 may not give the delay time τ, and stop updating the delay time τ of the delay unit 1330

The delay unit 1330 updates the set delay time τ based on the received delay time τ.

In present embodiment, the noise suppressing device 1 adaptively updates the delay time τ. However, when wind noise is occurring, the noise suppressing device 1 stops updating to prevent errors in estimating the arrival direction of ambient noise, and after the wind noise stops, is capable of maintaining the noise suppression performance as before the occurrence of wind noise.

Next, the processing by the noise suppressing device 1 of the present embodiment will be explained. The noise suppressing processing by the noise suppressing device 1 of the present embodiment is the same as that of the first embodiment, so with embodiment 1 as a reference, an explanation thereof is omitted. In the noise suppressing processing of the present embodiment, the noise suppressing mechanism 130 of the noise suppressing device 1, by the subtracting unit 1360, performs output based on the sound signal from the main sound receiving mechanism 101 after noise suppression, and gives the output to the noise direction estimating unit 1410.

Moreover, a control processing for an amount of suppression by the noise suppressing device 1 of the present embodiment is the same as that of the first embodiment, so with embodiment 1 as a reference, an explanation thereof is omitted. Through a control processing for an amount of suppression in the present embodiment, the noise suppressing mechanism 130 of the noise suppressing device 1, by the noise suppressing controller 1390, performs adjusting the amount of suppression by giving a control signal making for adjusting the amount of suppression according to the determining result of whether or not there is wind noise to the correction value calculating unit 1320, the adjusting unit 1350 and the noise direction estimating unit 1410.

Figure 12:
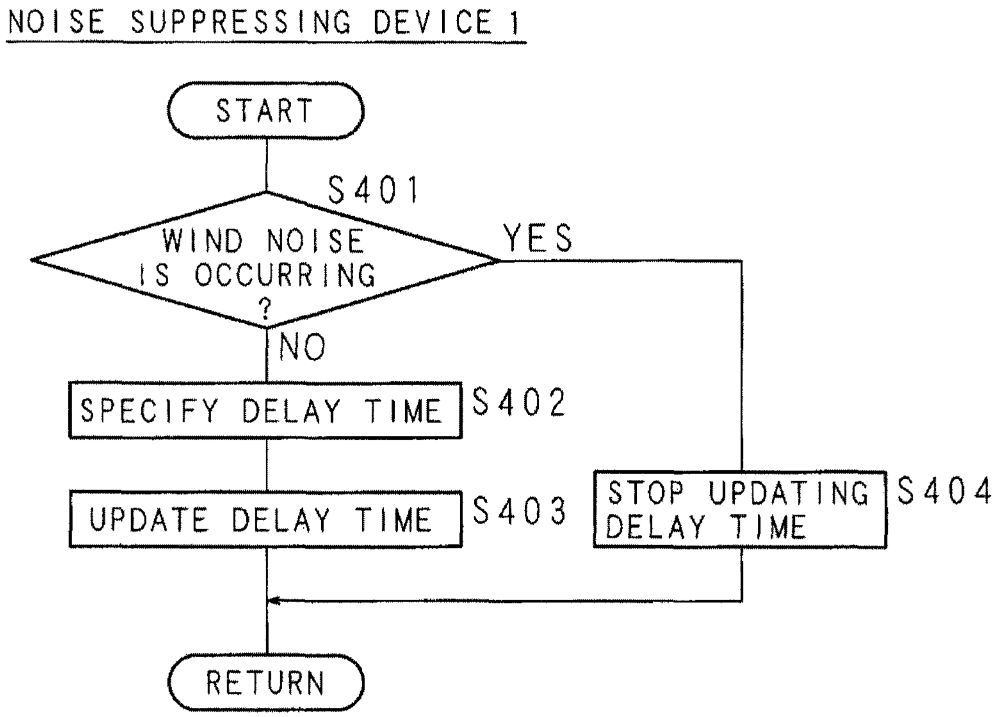
FIG. 12 is an operation chart illustrating an example of the noise direction estimating process of the noise suppressing device according to third embodiment.

FIG. 12 is an operation chart illustrating an example of the noise direction estimating process by the noise suppressing device 1 of the present embodiment. The noise suppressing device 1 of the present embodiment executes the noise direction estimation process at the same time as the noise suppressing process and control process of amount of suppression. The noise suppressing mechanism 130 of the noise suppressing device 1, by the noise direction estimating unit 1410, determines whether or not wind noise is occurring based on a control signal that is received from the noise suppressing controller 1390 (at the operation S401).

At the operation 5401, when it is determined that wind noise is not occurring (at the operation S401: NO), the noise suppressing mechanism 130 of the noise suppressing device 1, via the noise direction estimating unit 1410, specifies the delay time τ for which the power of the output signal from the subtracting unit 1360 becomes a minimum as the estimate of the arrival direction of ambient noise based on the sound signal from the main sound receiving mechanism 101 that was received from the subtracting unit 1360 (at the operation S402), and gives that identified delay time τ to the delay unit 1330 in order to update the delay time τ (at the operation S403).

At the operation S401, when it is determined that wind noise is occurring (at the operation S401: YES), by giving the previously identified delay time τ to the delay unit 1330 without performing the processing of step S402, updating of the delay time τ is essentially stopped (at the operation S404).

In this way, the noise suppressing device 1 of the present embodiment estimates the arrival direction of ambient noise, and by adaptively updating the delay time τ, prevents errors in estimation due to wind noise.

Embodiment 4

A fourth embodiment is an example wherein the noise suppressing device 1 of the first embodiment includes a plurality of devices.

Figure 13:
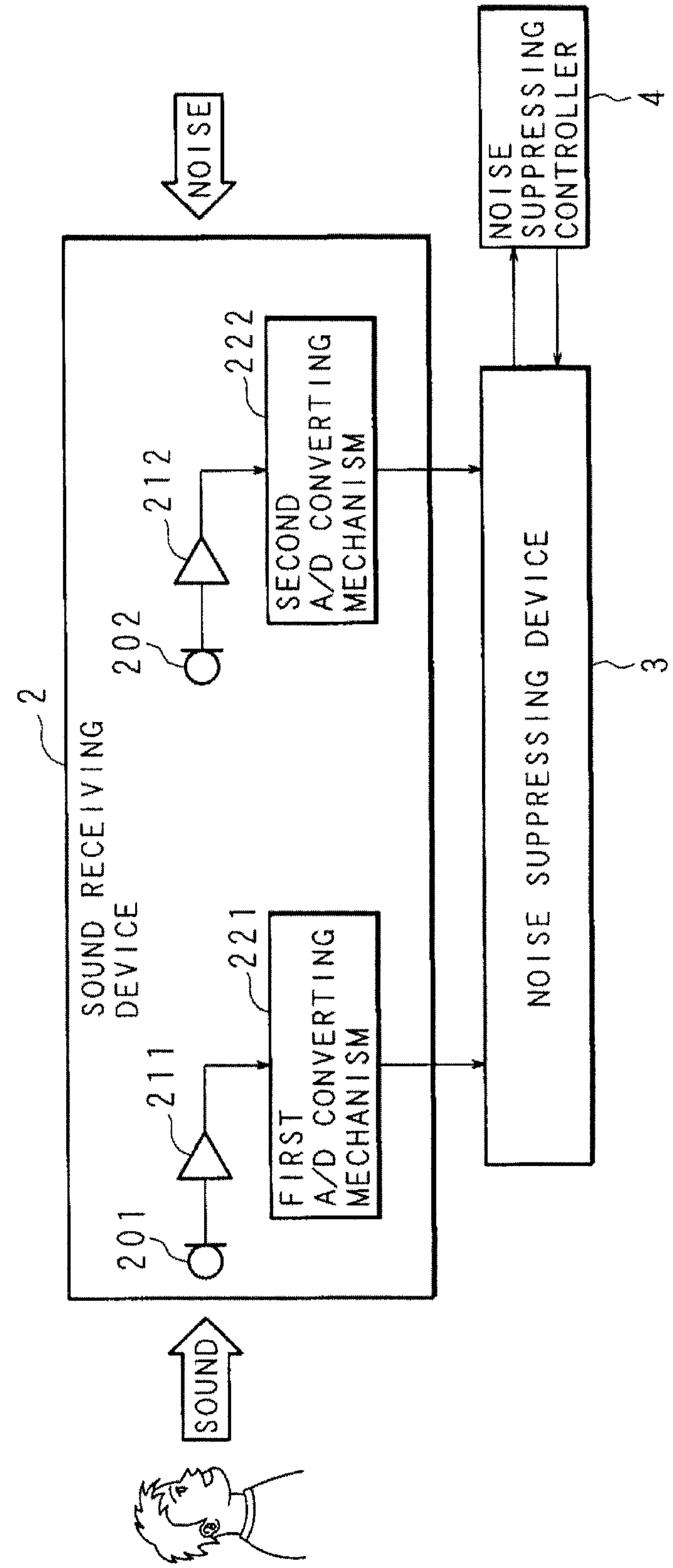
FIG. 13 is a block diagram illustrating an example of each device according to fourth embodiment.

FIG. 13 is a block diagram schematically illustrating an example of the various devices of fourth embodiment. In FIG. 13, reference number 2 is a sound receiving device such as a microphone array device, and a noise suppressing device 3 including a chip such as a VLSI for correcting a sound signal generated by the sound receiving device 2, and a noise suppressing controller 4 for controlling the amount of noise suppression by the noise suppressing device 3 connected to this sound receiving device 2. The noise suppressing device 3 and noise suppressing controller 4 may also be devices incorporated inside the sound receiving device 2 instead of being devices that are connected to the sound receiving device 2.

The sound receiving device 2 includes a main sound receiving mechanism 201, a sub sound receiving mechanism 202, a first amplification mechanism 211, a second amplification mechanism 212, a first A/D converting mechanism 221 and a second A/D converting mechanism 222. In addition, the sound receiving mechanism 2 amplifies sound signals based on sound received by both the first sound receiving mechanism 201 and the second sound receiving mechanism 202, converts the sound signals to digital signals and outputs the sound signals to the noise suppressing device 3 and the noise suppressing controller 4. In addition, as illustrated in FIG. 13, the sound receiving 2 device may also include various mechanisms presented in the figure such as a control mechanism, recording mechanism, communication mechanism and sound output mechanism.

Figure 14:
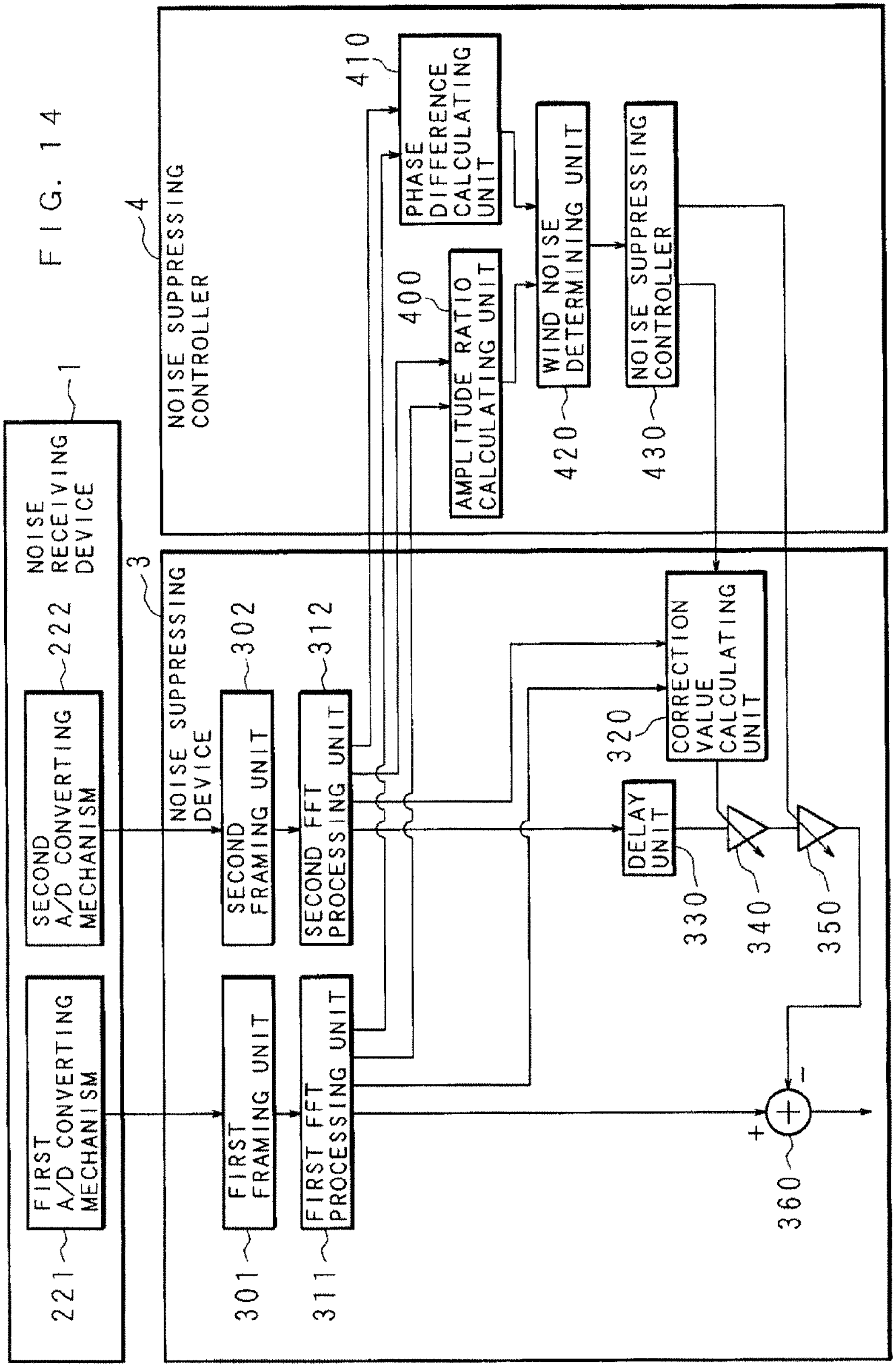
FIG. 14 is a function block diagram illustrating an example of functions of the noise suppressing device and noise suppressing controller according to fourth embodiment.

FIG. 14 is a function block diagram of an example of the functions of the noise suppressing device 3 and noise suppressing controller 4 of the present embodiment. The noise suppressing mechanism 3 executes various program modules such as a first framing unit 301, a second framing unit 302, a first FFT processing unit 311, a second FFT processing unit 312, a correction value calculating unit 320, a delay unit 330, a correcting unit 340, an adjusting unit 350 and a subtracting unit 360.

The noise suppressing controller 4 executes various program modules such as an amplitude ratio calculating unit 400, a phase difference calculating unit 410, a wind noise determining unit 420, and a noise suppression control unit 430. The functions and processing by this various program modules is the same as those described for the first embodiment, so with the first embodiment as a reference, an explanation thereof is omitted.

The first through fourth embodiment are examples of part of the limitless embodiments, wherein the various hardware and software may be adequately used, and various process other than the fundamental process of the examples may be combined.

For example, the embodiment may be expanded to the form wherein when applied to a device estimating the direction of a speaker and performs "delay-and-sum" to emphasize speech coming from the arrival direction, and it is determined that wind noise is occurring, stops estimating of the direction of the speaker. In that case, when wind noise is occurring, it is possible to prevent errors effectively in estimation of the direction of the speaker, and after the wind noise has ceased, maintaining the performance as before the wind noise occurred.

Moreover, the device executing a noise suppressing method such as spectral subtraction by estimating the level or spectrum of ambient noise may be used. Such device eliminates the adverse effects of wind noise by stopping the estimation of ambient noise or spectrum when it is determined that wind noise is occurring.

Furthermore, in the first through fourth embodiments, an example using a mobile telephone is described. However the embodiment is not limited to this, and various devices capable of receiving the sound of the wind such as a car navigation system installed in convertible may be used.

The wind mentioned in the first through fourth embodiments is not limited to a narrowly-defined form of wind indicating the air flow in the horizontal direction, but indicating all kind of flow in the turbulent state of which sound is received such as air current indicating the air flow in the vertical direction, human breath, and other flowing air.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of the superiority and inferiority of the embodiments. Although the embodiments have been described in detail, it should be understood that the various changes, substitutions and alterations could be made hereto without departing from the spirit and scope of the embodiment.

What is claimed is:

1. A noise suppressing device being operable with a plurality of sound receiving units for outputting a plurality of sound signals based on received sound, and that suppresses noise in the sound received by the sound receiving units, comprising:

- a suppressing unit for suppressing noise by subtracting a noise component derived on the basis of the plurality of sound signals output by the sound receiving units from the sound signals;
- a variation deriving unit for deriving a degree of variation by numerically quantizing the variation on the basis of an amplitude spectrum obtained by converting the plurality of sound signals to components on a frequency axis;

a determining unit for determining that wind noise is occurring due to wind blowing against the sound receiving units when the degree of variation is equal to or greater than a specified variation threshold value; and an adjusting unit for adjusting an amount of suppression according to the decision of the determining unit about whether or not wind noise is occurring; wherein the suppressing unit suppresses noise by subtracting the noise component from the sound signals based on the amount of suppression adjusted by the adjusting unit, wherein the determining is performed in accordance with $$\frac{1}{\omega_3 - \omega_2} \sum_{\omega_2}^{\omega_3} \phi(\omega)^2 > \beta$$

where ω is frequency, ϕ is phase difference and β is the variation threshold value, and where ω2 is a third frequency and ω3 is a fourth frequency higher than ω2.

2. The noise suppressing device according to claim 1, further comprising:

a correcting unit for correcting the level of the sound signals using a correction value derived on the basis of an amplitude ratio of the plurality of sound signals in order to correct difference in a sensitivity of the sound receiving units; wherein the correcting unit halts deriving of the correction value or correcting when the determining unit determines that wind noise is occurring.

3. The noise suppressing device according to claim 2, wherein the variation deriving unit derives the degree of variation obtained by numerically quantizing at least one of the variation between frequency of the phase difference of the plurality of sound signals based on a phase spectrum, and the variation of the amplitude between the plurality of sound signals based on an amplitude spectrum.

4. The noise suppressing device according to claim 3, wherein the determining unit further determines whether or not an average power of the sound signals in a specified frequency band is equal to or greater than a specified power threshold value, and the adjusting unit determines that wind noise is occurring when the determining unit determines that the degree of variation is equal to or greater than the variation threshold, and the average power is equal to or greater than the power threshold value.

5. The noise suppressing device according to claim 3, wherein the adjusting unit adjusts by at least one of the gradually increasing the amount of suppression when it is determined that wind noise is occurring, and the gradually decreasing the amount of suppression when it is determined that wind noise is not occurring.

6. The noise suppressing device according to claim 2, wherein the determining unit further determines whether or not an average power of the sound signals in a specified frequency band is equal to or greater than a specified power threshold value, and the adjusting unit determines that wind noise is occurring when the determining unit determines that the degree of variation is equal to or greater than the variation threshold, and the average power is equal to or greater than the power threshold value.

7. The noise suppressing device according to claim 2, wherein the adjusting unit adjusts by at least one of the gradually increasing the amount of suppression when it is determined that wind noise is occurring, and the gradually decreasing the amount of suppression when it is determined that wind noise is not occurring.

8. The noise suppressing device according to claim 2, further comprising:

a noise source estimating unit for estimating the direction of a noise source on the basis of the sound signals output from the sound receiving units; wherein the suppressing device reduces the noise component by the amount of suppression derived using the estimated direction of the noise source when it is determined that wind noise is not occurring; and the adjusting unit further adjusts the amount of suppression derived not using the estimated direction of the noise sound source when it is determined that wind noise is occurring.

9. The noise suppressing device according to one of claim 2, wherein the suppressing unit suppresses noise by subtracting a low-frequency component equal to or less than a specified frequency from the sound signals when it is determined that wind noise is occurring.

10. The noise suppressing device according to claim 1, wherein the variation deriving unit derives the degree of variation obtained by numerically quantizing at least one of the variation between frequency of the phase difference of the plurality of sound signals based on a phase spectrum, and the variation of the amplitude between the plurality of sound signals based on an amplitude spectrum.

11. The noise suppressing device according to claim 10, wherein the determining unit further determines whether or not an average power of the sound signals in a specified frequency band is equal to or greater than a specified power threshold value, and the adjusting unit determines that wind noise is occurring when the determining unit determines that the degree of variation is equal to or greater than the variation threshold, and the average power is equal to or greater than the power threshold value.

12. The noise suppressing device according to claim 10, wherein the adjusting unit adjusts by at least one of the gradually increasing the amount of suppression when it is determined that wind noise is occurring, and the gradually decreasing the amount of suppression when it is determined that wind noise is not occurring.

13. The noise suppressing device according to claim 1, wherein the determining unit further determines whether or not an average power of the sound signals in a specified frequency band is equal to or greater than a specified power threshold value, and the adjusting unit determines that wind noise is occurring when the determining unit determines that the degree of variation is equal to or greater than the variation threshold, and the average power is equal to or greater than the power threshold value.

14. The noise suppressing device according to claim 1, wherein the adjusting unit adjusts by at least one of the gradually increasing the amount of suppression when it is determined that wind noise is occurring, and the gradually decreasing the amount of suppression when it is determined that wind noise is not occurring.

15. The noise suppressing device according to claim 1, further comprising:

a noise source estimating unit for estimating the direction of a noise source on the basis of the sound signals output from the sound receiving units; wherein the suppressing device reduces the noise component by the amount of suppression derived using the estimated direction of the noise source when it is determined that wind noise is not occurring; and the adjusting unit further adjusts the amount of suppression derived not using the estimated direction of the noise sound source when it is determined that wind noise is occurring.

16. The noise suppressing device according to one of claim 1, wherein the suppressing unit suppresses noise by subtracting a low-frequency component equal to or less than a specified frequency from the sound signals when it is determined that wind noise is occurring.

17. The noise suppressing device according to claim 1, wherein the determining is performed in accordance with $$|20\log_{10}(S1(\omega)/S2(\omega))|>\alpha$$

where S1 is a first amplitude spectrum, S2 is a second amplitude spectrum, ω is frequency and α is the variation threshold value.

18. A noise suppressing device being operable with a plurality of sound receiving units for outputting a plurality of sound signals based on received sound, and that suppresses noise in the sound received by the sound receiving units, the noise suppressing device comprising:

a suppressing unit for suppressing noise by subtracting the noise component derived on the basis of the plurality of sound signals output by the sound receiving units;

a variation deriving unit for deriving a degree of variation by numerically quantizing the variation on the basis of an amplitude spectrum obtained by converting the plurality of sound signals to components on the frequency axis;

a determining unit for determining whether or not the degree of variation is equal to or greater a specified variation threshold value; and an adjusting unit that adjusts the amount of suppression when the determining unit determines that the degree of variation is equal to or greater than the variation threshold value; wherein the suppressing unit suppresses noise by subtracting the noise component from the sound signals on the basis of the amount of suppression adjusted by the adjusting unit, wherein the determining is performed in accordance with $$\frac{1}{\omega_3-\omega_2}\sum_{\omega_2}^{\omega_3}\phi(\omega)^2>\beta$$

where ω is frequency, ϕ is phase difference and β is the variation threshold value, and where ω2 is a third frequency and ω3 is a fourth frequency higher than ω2.

19. A noise suppressing controller for controlling a suppressing unit for suppressing a noise component in the sound received by the plurality of the sound receiving units on the basis of a plurality of sound signals output by the sound receiving units, comprising:

a variation deriving unit for deriving a degree of variation by numerically quantizing the variation on the basis of an amplitude spectrum obtained by converting the plurality of sound signals to components on the frequency axis;

a determining unit for determining that wind noise is occurring due to wind blowing against the sound receiving units, when the degree of variation derived by the variation deriving unit is equal to or greater than a variation threshold value; and a suppressing control unit for outputting, according to the decision of the determining unit about whether or not wind noise is occurring, an instruction to the suppressing unit to adjust the amount of suppression, wherein the determining is performed in accordance with $$\frac{1}{\omega_3-\omega_2}\sum_{\omega_2}^{\omega_3}\phi(\omega)^2>\beta$$

where ω is frequency, ϕ is phase difference and β is the variation threshold value, and where ω2 is a third frequency and ω3 is a fourth frequency higher than ω2.

20. A noise suppressing method using a computer being operable with a plurality of sound receiving units for outputting a plurality of sound signals based on received sound, that suppresses noise in the sound received by the sound receiving units, the noise suppressing method comprising:

deriving, using the computer, a degree of variation by numerically quantizing the variation on the basis of an amplitude spectrum obtained by converting the plurality of sound signals to components on the frequency axis;

determining, using the computer, that wind noise due to wind blowing against the sound receiving units is occurring when the derived degree of variation is equal to or greater than a variation threshold value; and adjusting, using the computer, the amount of suppression according to the decision about whether or not there is wind noise, wherein the determining is performed in accordance with $$\frac{1}{\omega_3-\omega_2}\sum_{\omega_2}^{\omega_3}\phi(\omega)^2>\beta$$

where ω is frequency, ϕ is phase difference and β is the variation threshold value, and where ω2 is a third frequency and ω3 is a fourth frequency higher than ω2.

21. A non-transitory computer-readable recording media storing a program for making a computer function as a noise suppressing device being operable with a plurality of sound receiving units for outputting a plurality of sound signals on the basis of the received sound, and that suppresses noise in the sound received by the sound receiving units, the program comprising:

deriving a degree of variation by numerically quantizing the variation on the basis of an amplitude spectrum obtained by converting the plurality of sound signals to components on the frequency axis;

determining whether or not the degree of variation derived by the variation deriving unit is equal to or greater than a specified variation threshold; and adjusting the amount of suppression when it is determined that the degree of variation is equal to or greater than the variation threshold, wherein the determining is performed in accordance with $$\frac{1}{\omega_3-\omega_2}\sum_{\omega_2}^{\omega_3}\phi(\omega)^2>\beta$$

where ω is frequency, ϕ is phase difference and β is the variation threshold value, and where ω2 is a third frequency and ω3 is a fourth frequency higher than ω2.

22. A noise suppressing device being operable with a plurality of sound receiving units for outputting a plurality of sound signals based on received sound, and that suppresses noise in the sound received by the sound receiving units, comprising:

a suppressing unit for suppressing noise by subtracting a noise component derived on the basis of the plurality of sound signals output by the sound receiving units from the sound signals;

a variation deriving unit for deriving a degree of variation by numerically quantizing the variation on the basis of an amplitude spectrum obtained by converting the plurality of sound signals to components on a frequency axis;

a determining unit for determining that wind noise is occurring due to wind blowing against the sound receiving units when the degree of variation is equal to or greater than a specified variation threshold value; and an adjusting unit for adjusting an amount of suppression according to the decision of the determining unit about whether or not wind noise is occurring; wherein the suppressing unit suppresses noise by subtracting the noise component from the sound signals based on the amount of suppression adjusted by the adjusting unit, wherein the determining is performed in accordance with $$\frac{1}{\omega_1-\omega_0}\sum_{w_0}^{\omega_1}S_1(\omega)^2>\gamma\frac{1}{\omega_1-\omega_0}\sum_{\omega_0}^{\omega_1}S_2(\omega)^2>\gamma$$

where S1 is a first amplitude spectrum, S2 is a second amplitude spectrum, ω is frequency and γ is the variation threshold value, and where ω0 is a first frequency and ω1 is a second frequency higher than ω0.

* * * * *

UNITED STATES PATENT AND TRADEMARK OFFICE

CERTIFICATE OF CORRECTION

PATENT NO. : 8,509,451 B2
APPLICATION NO. : 12/819035
DATED : August 13, 2013
INVENTOR(S) : Shoji Hayakawa It is certified that error appears in the above-identified patent and that said Letters Patent is hereby corrected as shown below:

In the Specification

In Col. 1, Line 12, delete "America" and insert -- America. --, therefor.

In the Claims

In Col. 20, Line 27, In Claim 9, delete "to one of" and insert -- to --, therefor.

In Col. 21, Line 24, In Claim 16, delete "to one of" and insert -- to --, therefor.

Signed and Sealed this
Tenth Day of December, 2013

Margaret A. Focarino

Margaret A. Focarino
*Commissioner for Patents of the United States Patent and Trademark Office*